United States Patent
Kim et al.

(10) Patent No.: US 9,780,024 B2
(45) Date of Patent: Oct. 3, 2017

(54) SEMICONDUCTOR PACKAGE AND MANUFACTURING METHOD THEREOF

(71) Applicant: Amkor Technology, Inc., Tempe, AZ (US)

(72) Inventors: In Ho Kim, Seoul (KR); Jae Yun Kim, Ansan-si (KR); Kyeong Sool Seong, Seoul (KR)

(73) Assignee: AMKOR TECHNOLOGY, INC., Tempe, AZ (US)

(*) Notice: Subject to any disclaimer, the term of this patent is extended or adjusted under 35 U.S.C. 154(b) by 0 days.

(21) Appl. No.: 15/052,219

(22) Filed: Feb. 24, 2016

(65) Prior Publication Data

US 2016/0254221 A1    Sep. 1, 2016

(30) Foreign Application Priority Data

Feb. 25, 2015  (KR) .................. 10-2015-0026601

(51) Int. Cl.
*H01L 23/498* (2006.01)
*H01L 23/00* (2006.01)
*H01L 23/31* (2006.01)

(52) U.S. Cl.
CPC ........ *H01L 23/49838* (2013.01); *H01L 24/05* (2013.01); *H01L 23/3192* (2013.01); *H01L 24/03* (2013.01); *H01L 24/11* (2013.01); *H01L 24/13* (2013.01); *H01L 2224/02235* (2013.01); *H01L 2224/02351* (2013.01); *H01L 2224/02375* (2013.01); *H01L 2224/02377* (2013.01); *H01L 2224/0345* (2013.01); *H01L 2224/0346* (2013.01); *H01L 2224/03452* (2013.01); *H01L 2224/0401* (2013.01); *H01L 2224/05008* (2013.01); *H01L 2224/05012* (2013.01); *H01L 2224/05014* (2013.01); *H01L 2224/05015* (2013.01); *H01L 2224/0558* (2013.01);

(Continued)

(58) Field of Classification Search
CPC ....... H01L 2924/014; H01L 2224/0239; H01L 2224/13111; H01L 24/13; H01L 2224/0401; H01L 23/49838; H01L 24/05; H01L 2224/131; H01L 24/11; H01L 2224/05647; H01L 2224/05015; H01L 2224/05014; H01L 2224/05008; H01L 2224/0346; H01L 2224/03452; H01L 2224/0345; H01L 2224/02377; H01L 2224/05569; H01L 2224/02351; H01L 2224/05012; H01L 2224/0558; H01L 23/3192; H01L 24/03; H01L 2924/00014; H01L 2224/05572; H01L 2924/00
See application file for complete search history.

(56) References Cited

U.S. PATENT DOCUMENTS 9,105,558 B2 * 8/2015 Kawai .............. H01L 21/02529
2013/0147033 A1   6/2013 Chen et al.
2014/0045326 A1   2/2014 Liang et al.

FOREIGN PATENT DOCUMENTS

KR          100858242 B1    9/2008

* cited by examiner

*Primary Examiner* — Roy Potter
(74) *Attorney, Agent, or Firm* — McAndrews, Held & Malloy, Ltd.

(57) ABSTRACT

A semiconductor package and a method of making a semiconductor package. As non-limiting examples, various aspects of this disclosure provide various semiconductor packages, and methods of making thereof, that comprise a conductive layer that comprises an anchor portion extending through at least one dielectric layer.

20 Claims, 10 Drawing Sheets

(52) U.S. Cl.
CPC ........... *H01L 2224/05569* (2013.01); *H01L 2224/05572* (2013.01); *H01L 2224/05647* (2013.01); *H01L 2224/1191* (2013.01); *H01L 2224/131* (2013.01); *H01L 2224/13022* (2013.01)

SEMICONDUCTOR PACKAGE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2015-0026601, filed on Feb. 25, 2015 in the Korean Intellectual Property Office and titled "SEMICONDUCTOR DEVICE AND FABRICATING METHOD THEREOF," the contents of which are hereby incorporated herein by reference in their entirety.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1A:
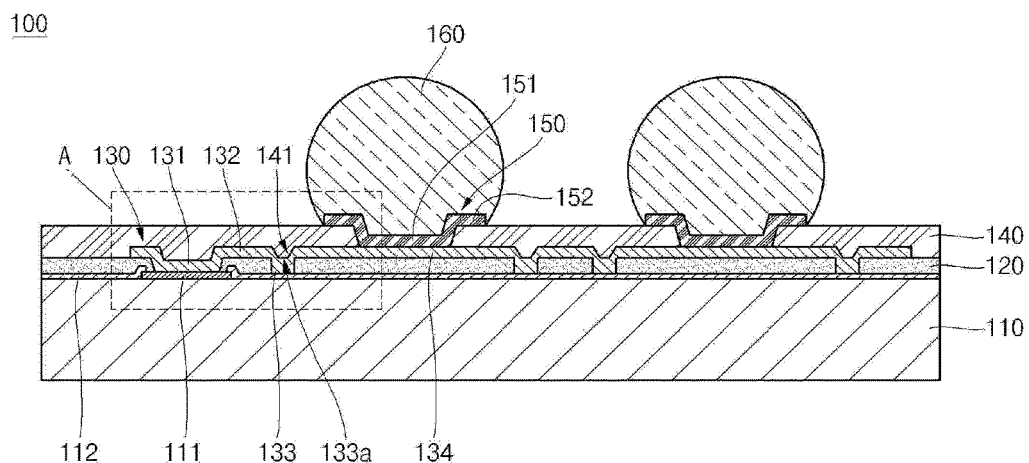
FIG. 1A shows a cross-sectional view of an example semiconductor device, in accordance with various aspects of the present disclosure.

Various aspects of this disclosure provide a semiconductor package and a method of making a semiconductor package. As non-limiting examples, various aspects of this disclosure provide various semiconductor packages, and methods of making thereof, that comprise a conductive layer that comprises an anchor portion extending through at least one dielectric layer.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Note that in general, same reference numerals will be utilized herein to represent same and/or similar components.

Various aspects of the present disclosure provide a semiconductor device or package and a manufacturing method thereof, which can decrease the cost, increase the reliability, and/or increase the manufacturability of the semiconductor device.

Various aspects of the present disclosure provide a semiconductor device, which can prevent or inhibit cracks and/or delamination from occurring to a structure for coupling a conductive layer, and a fabricating method thereof.

Various aspects of the present disclosure provide a semiconductor device, and a manufacturing method thereof, comprising a semiconductor die including a plurality of conductive pads (e.g., bond pads) and a passivation layer on its top surface, a first dielectric layer on a top surface of the semiconductor die, a conductive layer on the first dielectric layer, the conductive layer coupled to the conductive pads and including an anchor (or fixing) region that passes through the first dielectric layer and makes contact with the semiconductor die (e.g., a passivation layer thereof), and a second dielectric layer on the conductive layer.

The anchor (or fixing) region of the conductive layer may, for example, fill voids (e.g., openings, apertures, grooves, trenches, etc.) in the first dielectric layer and may be coupled to a surface to the semiconductor die (e.g., a passivation layer thereof). The anchor region may, for example, comprise dimples extending into a side of the anchor region (e.g., a side opposite a side of the anchor region facing the semiconductor die).

The conductive layer may, for example, comprise a bump region (e.g., a conductive ball or bump region, a metal post or pillar region, etc.) to be connected to an interconnection structure (e.g., a conductive ball or bump, a metal post or pillar, a general device or package interconnection structure, etc.) that provides connectivity to the semiconductor device from the outside. The anchor (or fixing) region may, for example, be positioned near or adjacent to the bump region.

The semiconductor device may, for example, comprise an under bump metal (UBM) structure on the second dielectric layer and in an aperture thereof and connected to a portion of the conductive layer (e.g., to a bump region thereof). The anchor region may, for example, have its center laterally offset from an end of the UBM structure (e.g., outside the footprint of the UBM structure and/or inside the footprint of the UBM structure).

The conductive layer may, for example, comprise a plurality of patterns (e.g., traces, pads, etc.) spaced apart from each other. The second dielectric layer or a portion thereof may, for example, be positioned between the patterns (e.g., traces, pads, etc.) forming the conductive layer.

The semiconductor device may, for example, comprise a solder bump or ball or other interconnection structure coupled to a position of the conductive layer (e.g., to a bump region, etc.) near or adjacent to the anchor region. The semiconductor device may, for example, comprise an encapsulant that encapsulates at least portions of side (or lateral) surfaces of the solder bump or ball or other interconnection structure.

Various aspects of the present disclosure provide a semiconductor device, and a manufacturing method thereof, comprising a semiconductor die including a plurality of conductive pads on its top surface, a first dielectric layer on a top surface of the semiconductor die, a conductive layer on the first dielectric layer, the conductive layer coupled to the conductive pads and including an anchor (or fixing) region, and a second dielectric layer on the conductive layer. The second dielectric layer may, for example, be coupled to the conductive layer while filling dimples in the conductive layer. The anchor (or fixing) region may, for example, pass through an aperture (or opening) in the first dielectric layer and contact the semiconductor die (e.g., a passivation layer thereof).

The conductive layer may, for example, comprise a bump region (e.g., a conductive ball or bump region, a conductive post or pillar region, a bonding region, etc.) to be connected to an interconnection structure (e.g., a device or package interconnection structure, etc.) that provides connectivity to the semiconductor device from the outside. The anchor (or fixing) region may, for example, be positioned near or adjacent to the bump region.

The semiconductor device may, for example, comprise an under bump metallization (UBM) structure on the second dielectric layer and in an aperture thereof and connected to a portion (e.g., a bump region) of the conductive layer. The anchor region may, for example, have its center laterally offset from an end of the UBM structure (e.g., outside the footprint of the UBM structure and/or inside the footprint of the UBM structure).

Various aspects of the present disclosure provide a method of manufacturing a semiconductor device, where the method comprises providing a semiconductor die including a plurality of conductive pads on its top surface; forming a first dielectric layer on a top surface of the semiconductor die; forming a conductive layer on the first dielectric layer, the conductive layer coupled to the conductive pads and including an anchor (or fixing) region that passes through the first dielectric layer and makes contact with the semiconductor die (e.g., a passivation layer thereof), and forming a second dielectric layer on the conductive layer.

The anchor region may, for example, comprise dimples extending into its upper side. The second dielectric layer may, for example, be formed to fill the dimples. The conductive layer may, for example, comprise a bump region (e.g., a conductive bump or ball region, a metal post or pillar region, etc.) to be connected to an interconnection structure (e.g., a conductive bump or ball, a metal post or pillar, a general device or package interconnection structure, etc.) that provides connectivity to the semiconductor device from the outside. The anchor (or fixing) region may, for example, be positioned near or adjacent to the bump region.

The manufacturing (or fabricating) method may, for example, comprising forming an under bump metallization (UBM) structure on the second dielectric layer and connected to a portion of the conductive layer. The anchor region may, for example, have its center laterally offset from an end of the UBM structure (e.g., outside the footprint of the UBM structure and/or inside the footprint of the UBM structure).

As described herein, in a semiconductor device according to various aspects of the present invention and the manufacturing method thereof, the conductive layer may be formed on the first dielectric layer while vertically passing through one or more apertures in the first dielectric layer. Accordingly, an anchor region making contact with the die passivation layer of the semiconductor die is provided, which anchors (or fixes) the position of the conductive layer relative to a top surface of the semiconductor die, thereby preventing or inhibiting the conductive layer from being distorted and cracks from being generated due to warpage of the semiconductor device, due to mechanical or thermal shock, etc.

In addition, the anchor (or fixing) region may be formed near or adjacent to a region (e.g., a bump region) where the under bump metal (UBM) structure and the interconnection structure are to be formed, thereby stably anchoring (or fixing) the position of the UBM structure and preventing or inhibiting the UBM structure and the interconnection structure from being released or cracks from developing.

Further, in an example implementation comprising forming the anchor region of the conductive layer by plating, a plated material may fill holes of the first dielectric layer, leaving dimples formed on the anchor region at the top side of the conductive layer (e.g., above the filled holes). The second dielectric layer may, for example, fill the dimples in the anchor region and provide additional structural stability.

The above and other aspects of the present disclosure will be described in or be apparent from the following description of various example implementations. Various aspects of the present disclosure will now be presented with reference to accompanying drawings.

Figure 1B:
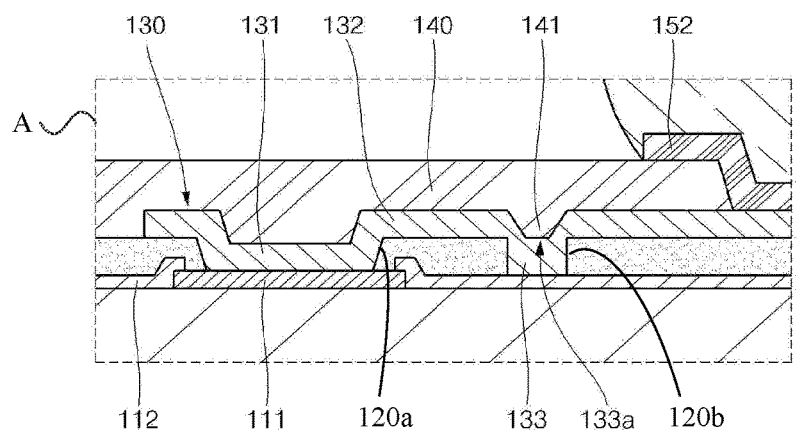
FIG. 1B is an enlarged view of a portion A of the example semiconductor device of FIG. 1A.
Figure 1C:
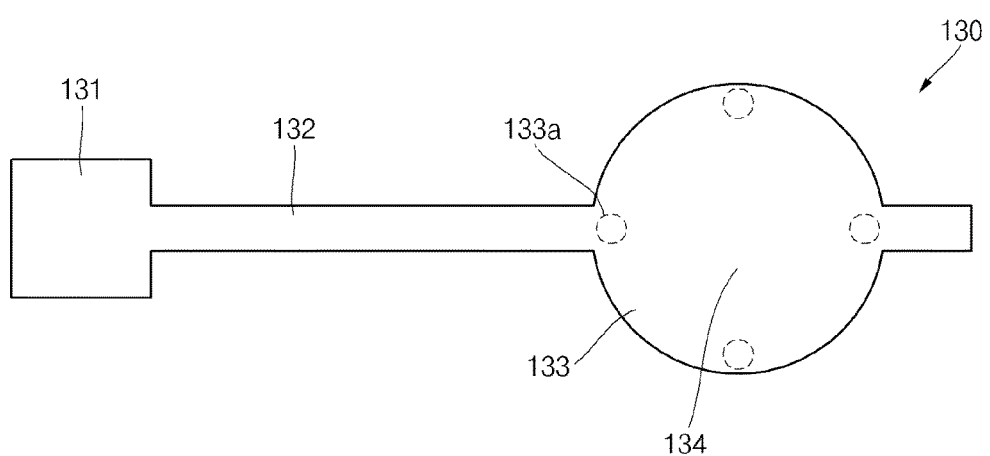
FIG. 1C is a plan view showing an example conductive layer of the example semiconductor device of FIG. 1A.

FIG. 1A shows a cross-sectional view of an example semiconductor device 100, in accordance with various aspects of the present disclosure. FIG. 1B is an enlarged view of a portion A of the example semiconductor device 100 of FIG. 1A. FIG. 1C is a plan view showing an example conductive layer 130 of the example semiconductor device 100 of FIG. 1A. FIGS. 1A-1C will now be discussed together.

The example semiconductor device 100 in accordance with various aspects of the present disclosure may comprise a semiconductor die 110 a first dielectric layer 120 on the semiconductor die 110, a conductive layer 130 on the first dielectric layer 120, a second dielectric layer 140 generally covering the conductive layer 130 and the first dielectric layer 120, an under bump metal (UBM) structure 150 on a portion of the conductive layer 130 exposed through an opening in the second dielectric layer 140 and on a portion of the dielectric layer 140 around the perimeter of the opening in the second dielectric layer 140, and an interconnection structure 160 on the under bump metal structure 150.

The semiconductor die 110 may, for example, comprise a functional die (e.g., a processor die, memory die, programmable logic die, application specific integrated circuit die, general logic die, etc.). Also for example, the semiconductor die 110 may comprise a semiconductor die comprising only signal routing structures (e.g., one or more dielectric layers and one or more conductive layers for distribution or redistributing electrical signals). Note that although this disclosure generally presents item 110 as a semiconductor die, the scope of this disclosure is not limited thereto. For example, item 110 may comprise any of a variety of other structures (e.g., a semiconductor layer, a dielectric layer, a glass layer, a laminate layer, a molding material layer, an interposer layer, a printed circuit board layer, any combination thereof, etc.) without departing from the scope of this disclosure.

The semiconductor die 110 may, for example, comprise a conductive pad 111 (or plurality thereof) on an upper side or surface thereof (as, for example, oriented in the figures herein). The conductive pad 111 may, for example, comprise a bond pad. The conductive pad 111 may, for example, provide for the inputting and/or outputting of electrical signals to and/or from the semiconductor die 110. The conductive pad 111 (or plurality thereof) may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive pad 111 may be formed in any of a variety of manners (e.g., electrolytic plating, electroless plating, chemical vapor deposition (CVD), sputtering or physical vapor deposition (PVD), plasma vapor deposition, printing, etc.), but the scope of the present disclosure is not limited thereto.

In addition, the semiconductor die 110 may comprise a die passivation layer 112, which may also be referred to as a dielectric layer, that surrounds and/or covers the lateral side(s) of the conductive pad 111 and/or a peripheral region of an upper side or surface of the conductive pad 111, and the upper side or surface of the semiconductor die 110. The die passivation layer 112 may comprise any or more of a variety of materials (e.g., inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material layer, a phenolic resin, an epoxy, etc.)), but the scope of the present disclosure is not limited thereto. The die passivation layer 112 may, for example, be formed in any of a variety of manners (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. The die passivation layer 112 may, for example, protect the upper side of the semiconductor die 110 and prevent short circuits from occurring between conductive pads and/or other conductive structures of the semiconductor die 110.

The first dielectric layer 120 may, for example, cover the upper side or surface of the semiconductor die 110. The first dielectric layer 120 may also be referred to as a passivation layer. The first dielectric layer 120 may comprise any or more of a variety of materials (e.g., inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.)), but the scope of the present disclosure is not limited thereto. The first dielectric layer 120 may, for example, be formed in any of a variety of manners (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto.

The first dielectric layer 120 may, for example, cover (e.g., entirely or partially) the upper surface of the die passivation layer 112 of the semiconductor die 110. A lower side or surface of the first dielectric layer 120 may, for example, directly contact the upper side or surface of the die passivation layer 112.

Openings (e.g., apertures, grooves, trenches, etc.) may be formed in the first dielectric layer 120 in any of a variety of manners. For example, such openings may be formed by ablating or removing material from the first dielectric layer 120 (e.g., utilizing laser ablation, mechanical ablation, chemical etching, etc.). Also for example, such openings may be formed by refraining from depositing the dielectric material at particular locations (e.g., by masking, selecting printing, etc.). In an example implementation, such openings may be formed utilizing a mask and photolithography to form a pattern of openings in the first dielectric layer 120.

The first dielectric layer 120 may also, for example, comprise an aperture 120a or opening therein (or a plurality thereof) that exposes the conductive pad 111 (or a plurality thereof) through the first dielectric layer 120. The first dielectric layer 120 may, for example, cover a peripheral region of the conductive pad 111, for example including and/or within a peripheral region of the conductive pad 111 covered by the die passivation layer 112. Therefore, a generally central region of the conductive pad 111 (or each of a plurality thereof) may be exposed by respective apertures or openings in the first dielectric layer 120 and in the die passivation layer 112. Such exposure may, for example, provide for connection of the conductive pad 111 to the conductive layer 130 discussed herein.

The first dielectric layer 120 may also comprise an aperture 120b or opening therein (e.g., a aperture, an opening, a grooves, a trench, etc.) therein (or a plurality thereof) that exposes the semiconductor die 110 (e.g., the die passivation layer 112 or other layer thereof) through the first dielectric layer 120. In an example implementation, the first dielectric layer 120 may comprise one or more apertures 120b positioned along or around the periphery of the UBM structure 150. In addition, one or more apertures 120b may be in the shape of a groove (e.g., a circular groove, a rectangular groove, etc.) that has a larger diameter (or width) than the UBM structure 150 (see FIG. 9E and FIG. 1A), a larger diameter (or width) than a portion of the UBM structure 150 (e.g., a central region 151) contacting the bond region 134 of the first conductive layer 130 (see FIG. 2A), etc. In an example implementation, a portion of the conductive layer 130 in the one or more apertures 120b in the shape of a groove may surround (e.g., laterally surround) the periphery of the UBM structure 150, or a periphery of the portion of the UBM structure 150 (e.g., a central region 151) contacting the bond region 134 of the conductive layer 130. Therefore, as discussed herein, the conductive layer 130 may contact the top surface of the semiconductor die 110 (e.g., the die passivation layer 112 or other layer thereof) through the aperture(s) 120b (e.g., opening, groove, trench, etc.) in the first dielectric layer 120. Accordingly, a position of the conductive layer 130 may be anchored, for example its position stably fixed, thereby enhancing the reliability in coupling components to the conductive layer 130. Note that some or all of the aperture(s) 120b might not extend completely through the first dielectric layer 120.

The conductive layer 130 may, for example, generally cover the first dielectric layer 120, extending through various apertures (e.g., openings, grooves, trenches, etc.) therein. The conductive layer 130 may also be referred to as a redistribution layer. The conductive layer 130 may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive layer 130 may be formed or deposited utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto.

The conductive layer 130 may, for example, provide an electrical path between the conductive pad 111 of the semiconductor die 110 and the UBM structure 150. The conductive layer 130 may, for example, comprise a pad region 131 on the conductive pad 111 of the semiconductor die 110, a bump region 134 under the under bump metal structure 150, an extension region 132 generally extending from the pad region 131 to the bump region 134, and an anchor region 133 (or fixing region) connected to the extension region 132 and passing at least partially through the first dielectric layer 120 (e.g., toward the die passivation layer 112, etc.).

The pad region 131 of the conductive layer 130 generally corresponds to the conductive pad 111 of the semiconductor die 110. For example, the pad region 131 may be formed on or directly on the conductive pad 111. For example, each of a plurality of such pad regions 131 may correspond to a respective conductive pad 111 of the semiconductor die. The pad region 131 may, for example, contact the conductive pad 111 of the semiconductor die 110 through an aperture or opening in the first dielectric layer 120, through an aperture or opening in the die passivation layer 112, etc. As shown in FIGS. 1A and 1B, the pad region 131 of the conductive layer 130 extends through an opening in the first dielectric layer 120 and through an opening in the die passivation layer 112 to contact the conductive pad 111 of the semiconductor die 110.

The extension region 132 of the conductive layer 130 extends from the pad region 131 along the top side or surface of the first dielectric layer 120. The extension region 132 is illustrated as being linear but may vary in its shape according to the design, thereby providing an electrical path between the pad region 131 and the bump region 134.

The anchor region 133 (or fixing region) of the conductive layer 130 is coupled to the extension region 132 and/or the bond region 134. The anchor region 133 may, for example, pass vertically at least partially through one or more of the apertures 120b in the first dielectric layer 120 (e.g., through an aperture or plurality thereof, through a groove or a plurality thereof, etc.). Accordingly, the anchor region 133 may, in various implementations, contact the die passivation layer 112 of the semiconductor die 110 through such apertures 120b. The anchor region 133 thus provides for the conductive layer 130 to be anchored (or fixed) in position, for example anchored to a top side or surface of the semiconductor die 110 (e.g., to a die passivation layer 112 or other layer thereof). Therefore, the anchor region 133 may prevent or inhibit the conductive layer 130 from being distorted and/or prevent or inhibit cracks from being generated due to warpage of the semiconductor device 100, due to mechanical shock, due to temperature-related stresses, etc.

As shown in FIG. 1C, the anchor region 133 (or fixing region) of the conductive layer 130 may be formed near or adjacent to the bump region 134, where the UBM structure 150 and the interconnection structure 160 are positioned. Since the anchor region 133 anchors (or fixes) the position of the bump region 134 and thus the UBM structure 150 formed thereon, the anchor region 133 may prevent or inhibit the UBM structure 150 and the interconnection structure 160 from being released or from cracks from being developed. Though the anchor region 133 and/or the bump region 134 are shown as being generally circular, many other shapes may be utilized, as will be discussed herein (e.g., with regard to FIGS. 4-7).

During the forming of the fixing region 133 (e.g., utilizing plating or any of the processes discussed herein with regard to the conductive layer 130), as a plated or otherwise deposited conductive material fills the aperture 120b (or aperture, groove, trench, divot, etc.) in the first dielectric layer 120, a dimple 133a may be formed on or over the fixing region 133. As discussed herein, another material such as the second dielectric layer 140 may (e.g., at label 141) protrude into the dimple 133a, providing additional structural stability for the conductive layer 130 and/or the second dielectric layer 140. For example, the dimple 133a may enhance the adhesion between the second dielectric layer 140 and the conductive layer 130.

In an example implementation, the bump region 134 may be surrounded by the anchor region 133. As discussed herein, the anchor region 133 and/or the bump region 134 may comprise any of a variety of shapes or configurations, and may comprise any number of individual anchor regions 133 (e.g., at which the conductive layer 130 extends into and/or through the first dielectric layer 120). As explained herein, the bump region 134 may be exposed through an opening in the second dielectric layer 140. Accordingly, the UBM structure 150 and the interconnection structure 160 may be formed on the bump region 134.

It should be noted that although item 134 is referred to as a bump region 134, and item 150 is referred to as an under bump metal, the scope of the present disclosure is not limited to any particular type of interconnection structure or under metallization. For example, as discussed herein, the interconnection structure 160 may comprise any of a variety of different materials and/or configurations.

The second dielectric layer 140 may, for example, cover the upper side of the conductive layer 130 and may also fill spaces between individual patterns or traces of the conductive layer 130. The second dielectric layer 140 may also be referred to as a passivation layer. The second dielectric layer 140 may comprise any or more of a variety of materials (e.g., inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.)), but the scope of the present disclosure is not limited thereto. The second dielectric layer 140 may, for example, be formed in any of a variety of manners (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. The second dielectric layer 140 may, for example, be formed of the same material as the first dielectric layer 120 or may be formed of a different material. Also, the second dielectric layer 140 may be formed using a same process as the first dielectric layer 120 or may be formed utilizing a different process.

For example, openings (e.g., apertures, grooves, trenches, etc.) may be formed in the second dielectric layer 140 in any of a variety of manners. For example, such openings may be formed by ablating or removing material from the dielectric layer (e.g., laser ablation, mechanical ablation, chemical etching, etc.). Also for example, such openings may be formed by refraining from depositing the dielectric material at particular locations (e.g., by masking, selecting printing, etc.). In an example implementation, openings in the second dielectric layer 140 may be formed utilizing a mask and photolithography to form a pattern of openings in the second dielectric layer 140.

The second dielectric layer 140 may, for example, cover and/or surround the pad region 131, the extension region 132 and the anchor region 133 of the conductive layer 130, while exposing the bump region 134 (e.g., exposing only the bump region 134) of the conductive layer 130.

For example, an upper portion or side of the bump region 134 may be exposed from the second dielectric layer 140 through a corresponding aperture or opening through the second dielectric layer 140. In addition, the second dielectric layer 140 may comprise a protrusion 141 that extends into the dimple 133a, for example interlocking with the dimple 133a, provided in the anchor region 133 of the conductive layer 130. As discussed herein, such coupling between the protrusion 141 of the second dielectric layer 140 and the dimple 133a in the anchor region 133 generally enhances the structural integrity of the device 100, for example enhancing the adhesion of the second dielectric layer 140 to the conductive layer 130.

Though the example semiconductor devices provided herein (e.g., device 100 of FIG. 1, device 200 of FIG. 2, device 300 of FIG. 3, etc.) are shown with first and second dielectric layers and a single conductive layer, any number of such layers may be provided. In an example scenario in which many dielectric layers are provided, the anchor region (and the apertures in which the anchor region is positioned) may extend through a single dielectric layer to an underlying dielectric layer (e.g., not necessarily to a die passivation layer of the semiconductor die). Also for example, the anchor region (and the apertures in which the anchor region is positioned) may extend through multiple dielectric layers to reach an underlying layer (e.g., to reach a die passivation layer, another dielectric layer, etc.).

The under bump metal (UBM) structure 150 is coupled to the bump region 134 exposed through an aperture in the second dielectric layer 140. The UBM structure 150 may, for example, be positioned between the conductive layer 130 and the interconnection structure 160. In an example implementation, the UBM structure 150, which may also be referred to as an under bump metallization structure 150, may for example comprise a layer of titanium-tungsten (TiW), which may be referred to as a layer or seed layer. Such layer may, for example, be formed by sputtering. Also for example, the UBM structure 150 may comprise a layer of copper (Cu) on the layer of TiW. Such layer may also, for example, be formed by sputtering. In another example implementation, forming a UBM structure 150 may comprise forming a layer of titanium (Ti) or titanium-tungsten (TiW) by sputtering, (ii) forming a layer of copper (Cu) on the titanium or titanium-tungsten layer by sputtering, and (iii) forming a layer of nickel (Ni) on the copper layer by electroplating. Note however, that the UBM structure 150 and/or processes utilized to form the UBM structure 150 are not limited to the examples given. For example, the UBM structure 150 may comprise a multilayered structure of chrome/chrome-copper alloy/copper (Cr/Cr—Cu/Cu), titanium-tungsten alloy/copper (Ti—W/Cu), aluminum/nickel/copper (Al/Ni/Cu), equivalents thereof, combinations thereof, etc.

The UBM structure 150 positioned between the bump region 134 of the conductive layer 130 and the interconnection structure 160, generally enhances the structural integrity of the connection between the interconnection structure 160 and the conductive layer 130 through the UBM structure 150. The UBM structure 150 may, for example, comprise a central region 151 coupled to the bump region 134 of the conductive layer 130 and an end region 152 extending from the periphery of the central region 151 and disposed on the second dielectric layer 140. For example, the end region 152 may form a ring on top of the second dielectric layer 140 around the central region 151.

The interconnection structure 160 is on the UBM structure 150. The interconnection structure 160 may comprise any of a variety of characteristics. For example, the interconnection structure 160 may comprise a conductive ball or solder ball, a conductive bump or solder bump, a wafer bump, a metal post or pillar, a wire, a lead, etc. The interconnection structure 160 may be formed in any of a variety of manners. For example, the interconnection structure 160 may be formed by ball dropping, plating, printing, pasting and reflowing, wire bonding, etc. The interconnection structure 160 may, for example, generally provide for a mechanical and electrical connection between the semiconductor device 100 and an external circuit (e.g., a module substrate, a motherboard, another electrical device, etc.).

As discussed herein, the anchor region 133 (or fixing region) might laterally surround the entire UBM structure 150 (e.g., both the center region 151 and the end region 152), but might alternatively surround just the center region 151 while positioned wholly or at least partially below the end region 152. An example of such a configuration is provided at FIGS. 2A and 2B.

Figure 2A:
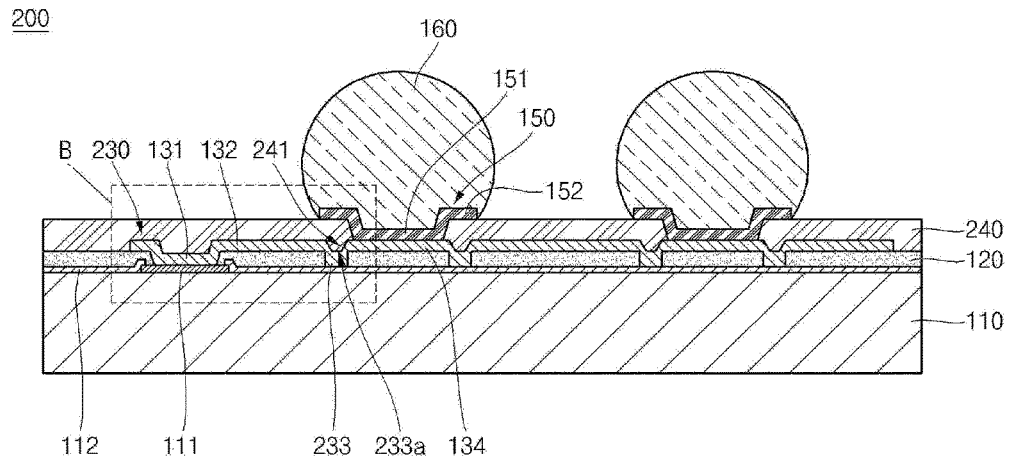
FIG. 2A shows a cross-sectional view of an example semiconductor device, in accordance with various aspects of the present disclosure.
Figure 2B:
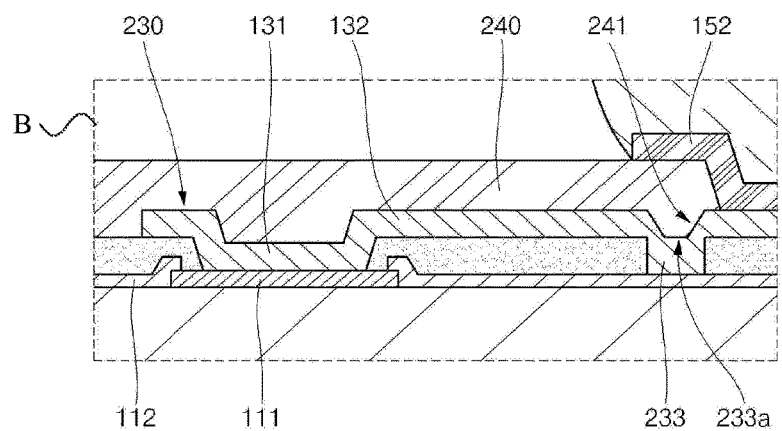
FIG. 2B is an enlarged view of a portion B of the example semiconductor device of FIG. 2A.

FIG. 2A shows a cross-sectional view of an example semiconductor device 200, in accordance with various aspects of the present disclosure. FIG. 2B is an enlarged view of a portion B of the example semiconductor device 200 of FIG. 2A. The example semiconductor device 200 may, for example, share any or all characteristics with the example semiconductor device 100 shown in FIGS. 1A-1C and discussed herein. The discussion will now focus on differences between the example semiconductor device 200 of FIGS. 2A-2B and the example semiconductor device 100 of FIGS. 1A-1C. Same components are generally denoted herein by the same reference numerals.

The example semiconductor device 200, in accordance with various aspects of the present disclosure, may comprise a semiconductor die 110, a first dielectric layer 120, a conductive layer 230, a second dielectric layer 240, a UBM structure 150, and an interconnection structure 160.

The conductive layer 230 may, for example, share any or all characteristics with the conductive layer 130 of FIGS. 1A-1C, and the anchor region 233 may, for example, share any or all characteristics with the anchor region 133 of FIGS. 1A-1C. The conductive layer 230 may, for example, be formed or configured such that the anchor region 233, or a portion thereof, is positioned laterally within the footprint of the UBM structure 150. For example, as shown in FIGS. 2A-2B, the anchor region 233 is positioned below the end region 152 of the UBM structure 150. For comparison, refer to FIG. 1A, which shows the anchor region 133 outside of the footprint of the UBM structure 150 (or laterally outside the end region 152 of the UBM structure 150). Such a configuration provides for the anchor region 233 to be closer to the bump region 134 and the central region 151 of the UBM structure 150 than in the example semiconductor device 100 shown in FIGS. 1A-1C. Although not shown herein, the anchor region 133 (or a portion thereof) may be within the footprint of the central region 151 (e.g., under the central region 151, or directly between the central region 151 and the semiconductor die 110).

As with the anchor region 133 of the conductive layer 130 of FIGS. 1A-1C, the anchor region 233 may also comprise a dimple 233a in the upper (or top) side or surface thereof. As with the anchor region 233, the dimple 233a of the anchor region 233 (or a portion thereof) may, for example, be positioned within the footprint of the UBM structure 150 (e.g., below the end region 152).

The second dielectric layer 240 may, for example, share any or all characteristics with any of the dielectric layers discussed herein. The second dielectric layer 240 may, for example, comprise a protrusion 241 corresponding to (e.g., extending into) the dimple 233a. Therefore, the structural integrity of the example semiconductor device 200 (e.g., the structural integrity of the bond between the second passivation layer 240 and the conductive layer 230) is enhanced.

Any of the example semiconductor devices discussed herein (e.g., the semiconductor device 100 of FIG. 1, the semiconductor device 200 of FIG. 2, etc.) may be encapsulated (e.g., partially encapsulated, wholly encapsulated, etc.). For example, a side of the semiconductor device having the interconnection structures 160 may be encapsulated. The example semiconductor device 300 shown at FIG. 3 provides an example of such encapsulation.

Figure 3:
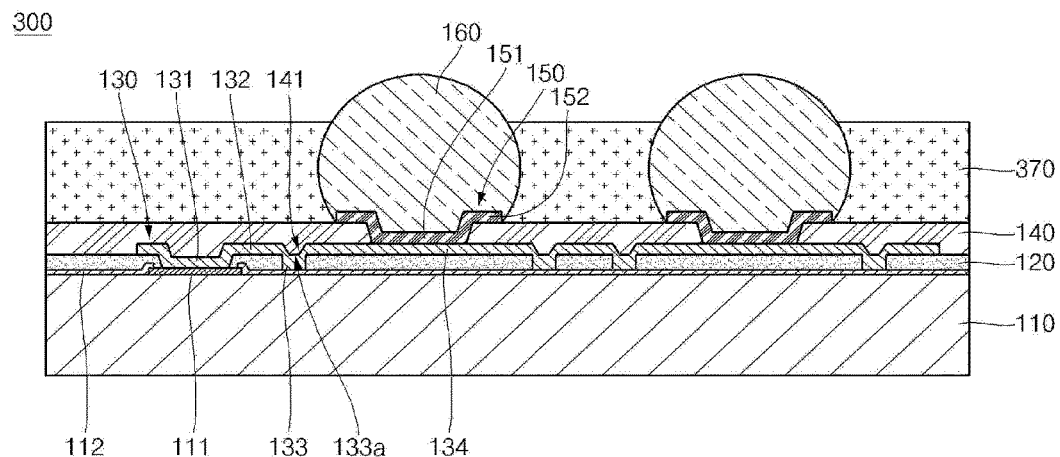
FIG. 3 shows a cross-sectional view of an example semiconductor device, in accordance with various aspects of the present disclosure.

FIG. 3 shows a cross-sectional view of an example semiconductor device 300, in accordance with various aspects of the present disclosure. The example semiconductor device 300 may, for example, share any or all characteristics with any other semiconductor device provided herein (e.g., the semiconductor device 100 of FIG. 1, the semiconductor device 200 of FIG. 2, etc.). The discussion will now focus on differences between the example semiconductor device 300 of FIG. 3 and the example semiconductor devices 100 and 200 of FIGS. 1A-1C and FIGS. 2A-2B, respectively. Same components are generally denoted herein by the same reference numerals.

The example semiconductor device 300, in accordance with various aspects of the present disclosure, may comprise a semiconductor die 110, a first dielectric layer 120, a conductive layer 130, a second dielectric layer 140, a UBM structure 150, an interconnection structure 160, and an encapsulant 370.

The encapsulant 370 may be formed in any of a variety of manners (e.g., compression molding, transfer molding, liquid encapsulant molding, vacuum lamination, paste printing, film assisted molding, etc.). The encapsulant 370 may comprise any of a variety of encapsulating or molding materials (e.g., resin, polymer, polymer composite material (for example, epoxy resin with filler, epoxy acrylate with filler, or polymer with a proper filler), etc.

The encapsulant 370 may, for example, encapsulate the periphery of the interconnection structure 160. In the example shown in FIG. 3, the encapsulant 370 has a height less than the height of the interconnection structure 160 (e.g., a conductive bump or ball, etc.), thereby exposing a top portion of the interconnection structure 160. Therefore, the encapsulant 370 may allow the interconnection structure 160 to be connected to an external circuit while protecting the interconnection structure 160. In the example semiconductor device 300, the encapsulant 370 covers over half of the height of the interconnection structure 160. In other example implementations, the encapsulant 370 may cover half or less than half of the interconnection structure 160. In the example semiconductor device 300, a portion of the encapsulant 370 is vertically over a lateral portion of the interconnection structure 160, for example providing additional structural stability by locking down the interconnection structure 160.

Note that in any of the example semiconductor devices provided herein (e.g., device 100 of FIGS. 1A-1C, device 200 of FIGS. 2A-2B, device 300 of FIG. 3, etc.), the lateral side surfaces of the semiconductor die 100, die passivation layer 112, first dielectric layer, second dielectric layer, and/or encapsulant may be coplanar. Also note that although the examples shown generally only present a portion of a single semiconductor device, the aspects discussed herein readily extend to entire semiconductor devices, wafers of semiconductor devices, etc.

As discussed herein, the conductive layer 130 may comprise any of a variety of shape characteristics. A plan view of a first example conductive layer was provided at FIG. 1C and discussed herein. Additional examples of the conductive layer will now be discussed with regard to FIGS. 4-7. Any or all of the example conductive layers provided herein may share any or all of the characteristics of other example conductive layers (e.g., 130, 430, 530, 630, and 730) provided herein.

Figure 4:
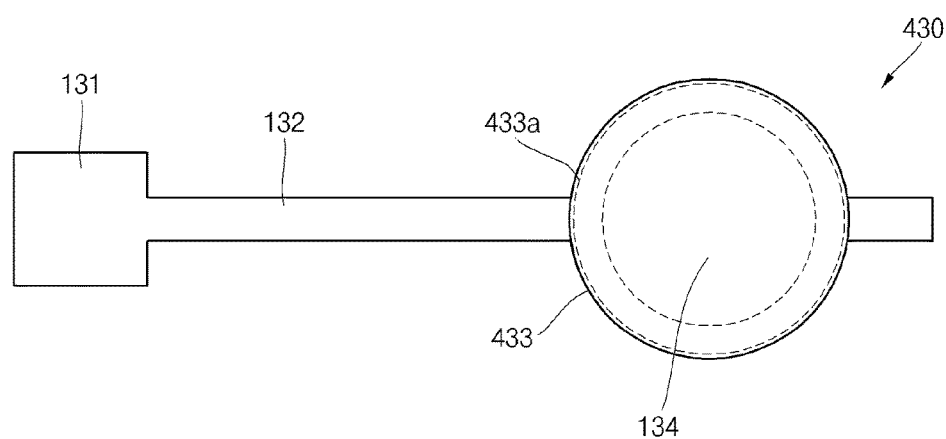
FIG. 4 is a plan view showing an example conductive layer of a semiconductor device, in accordance with various aspects of the present disclosure.

FIG. 4 is a plan view showing an example conductive layer 430 of a semiconductor device, in accordance with various aspects of the present disclosure. The example conductive layer 430 comprises an anchor region 433 (or fixing region) that is ring-shaped (or circle-shaped). For example, the example anchor region 433 encircles the bump region 134 and comprises a dimple 433a (e.g., on the side thereof opposite the side facing the die) that also encircles the bump region 134.

Note that the example anchor region 433 (and/or dimple 433a) may comprise a continuous ring, but may also comprise a plurality of segments forming the ring. Also note that as discussed herein, the anchor region 433 may be positioned outside the footprint of the UBM structure 150, positioned partially or wholly under the end region 152 of the UBM structure 150, etc.

Figure 5:
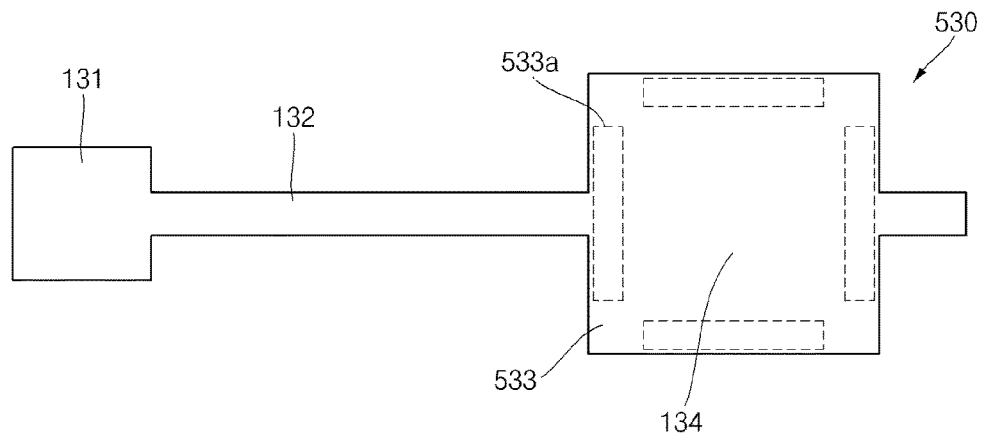
FIG. 5 is a plan view showing an example conductive layer of a semiconductor device, in accordance with various aspects of the present disclosure.

FIG. 5 is a plan view showing an example conductive layer 530 of a semiconductor device, in accordance with various aspects of the present disclosure. The example conductive layer 530 comprises an anchor region 533 (or fixing region) that is rectangular-shaped (or square-shaped). For example, the example anchor region 533 surrounds the bump region 134 and comprises a set of dimples 533a (e.g., on the side thereof opposite the side facing the die) that also surround the bump region 134.

Note that the example anchor region 533 (and/or dimples 533a) comprises a plurality of segments, but may also comprise a continuous rectangle. Also note that as discussed herein, the anchor region 533 may be positioned outside the foot print of the UBM structure 150, positioned partially or wholly under the end region 152 of the UBM structure 150, etc.

Figure 6:
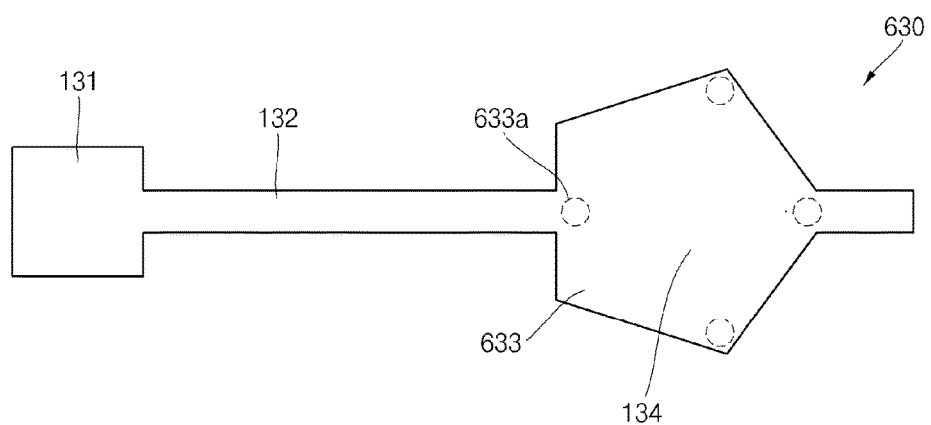
FIG. 6 is a plan view showing an example conductive layer of a semiconductor device, in accordance with various aspects of the present disclosure.

FIG. 6 is a plan view showing an example conductive layer 630 of a semiconductor device, in accordance with various aspects of the present disclosure. The example conductive layer 630 comprises an anchor region 633 (or fixing region) that is pentagon-shaped. For example, the example anchor region 633 surrounds the bump region 134 and comprises a set of dimples 633a (e.g., on the side thereof opposite the side facing the die) that also surround the bump region 134. The dimples 633a, as with all dimples discussed herein, may for example be circular, elliptical, polygonal, etc.

Note that the example anchor region 633 (and/or dimples 633a) comprises a plurality of elements, but may also comprise a continuous pentagon. Also note that as discussed herein, the anchor region 633 may be positioned outside the foot print of the UBM structure 150, positioned partially or wholly under the end region 152 of the UBM structure 150, etc.

Figure 7:
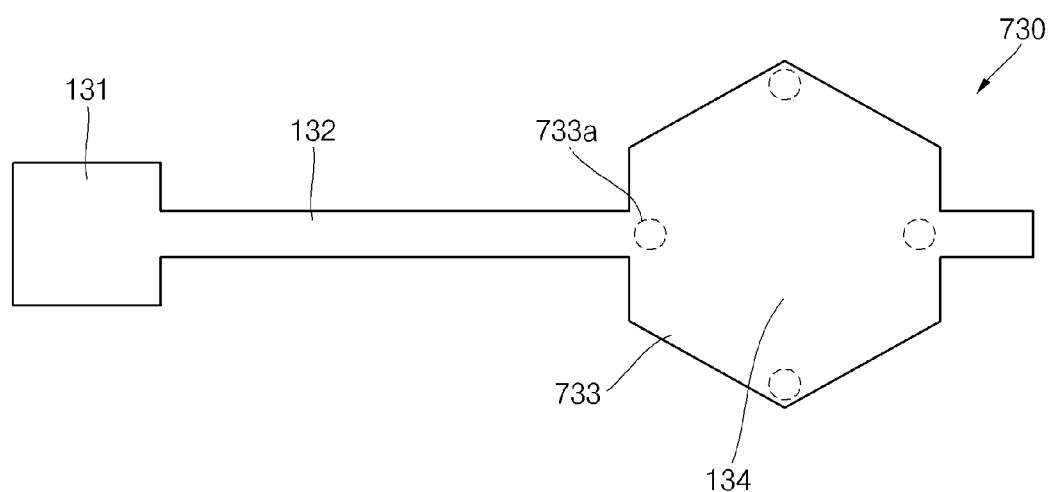
FIG. 7 is a plan view showing an example conductive layer of a semiconductor device, in accordance with various aspects of the present disclosure.

FIG. 7 is a plan view showing an example conductive layer 730 of a semiconductor device, in accordance with various aspects of the present disclosure. The example conductive layer 730 comprises an anchor region 733 (or fixing region) that is hexagon-shaped. For example, the example anchor region 733 surrounds the bump region 134 and comprises a set of dimples 733a (e.g., on the side thereof opposite the side facing the die) that also surround the bump region 134.

Note that the example anchor region 733 (and/or dimples 733a) comprises a plurality of elements, but may also comprise a continuous hexagon. Also note that as discussed herein, the anchor region 733 may be positioned outside the foot print of the UBM structure 150, positioned partially or wholly under the end region 152 of the UBM structure 150, etc.

Though many examples of conductive layer and/or anchor region shapes are provided herein, it should be understood that any of a variety of other shapes or configurations (e.g., circles, ellipses, N-sided polygons, etc.) are also within the scope of this disclosure. The discussion will now turn to an example method of manufacturing a semiconductor device and/or portions thereof, for example the various example semiconductor devices provided herein.

Figure 8:
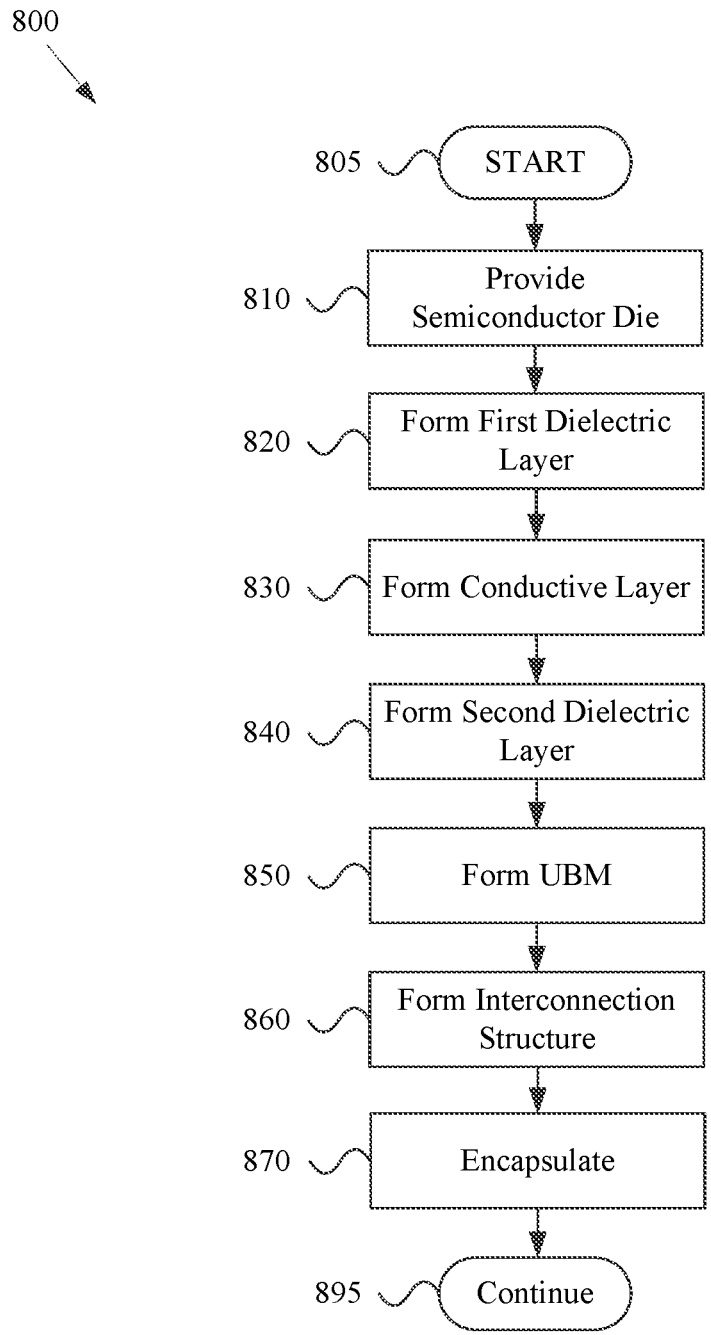
FIG. 8 shows a flow diagram of an example method of making a semiconductor device, in accordance with various aspects of the present disclosure.

FIG. 8 shows a flow diagram of an example method 800 of making a semiconductor device, in accordance with various aspects of the present disclosure. The example method 800 may, for example, share any or all characteristics with any other method discussed herein. FIGS. 9A-9G show cross-sectional views illustrating an example semiconductor device and an example method of making a semiconductor device, in accordance with various aspects of the present disclosure. The structures shown in 9A-9G may share any or all characteristics with analogous structures shown in FIGS. 1-7. FIGS. 9A-9G may, for example, illustrate an example semiconductor package at various stages (or blocks) of the example method 800 of FIG. 8. FIGS. 8 and 9A-9G will now be discussed together. It should be noted that the order of the example blocks of the example method 800 may vary without departing from the scope of this disclosure.

The example method 800 begins executing at block 805. The example method 800 may begin executing in response to any of a variety of causes or conditions. For example, the example method 800 may begin executing in response to receiving execution flow from any of the other blocks of the example method 800 or any other method. Also for example, the example method 800 may begin executing in response to arrival of components at a manufacturing site or station, in response to operator command, in response to a received customer order, etc. The scope of various aspects of this disclosure should not be limited by characteristics of any particular initiating cause or condition.

The example method 800 may, at block 810, comprise providing a semiconductor die. The provided die may, for example, share any or all characteristics with any semiconductor die (e.g., example semiconductor die 110, etc.) provided herein. The semiconductor die may, for example, comprise a processor die, memory die, programmable logic die, application specific integrated circuit die, general logic die, etc. Block 810 may, for example, comprise providing the die (e.g., providing the die to a manufacturing station or line) in wafer form (e.g., in the form of a semiconductor wafer comprising a plurality of die) or in single-die form.

Figure 9A:
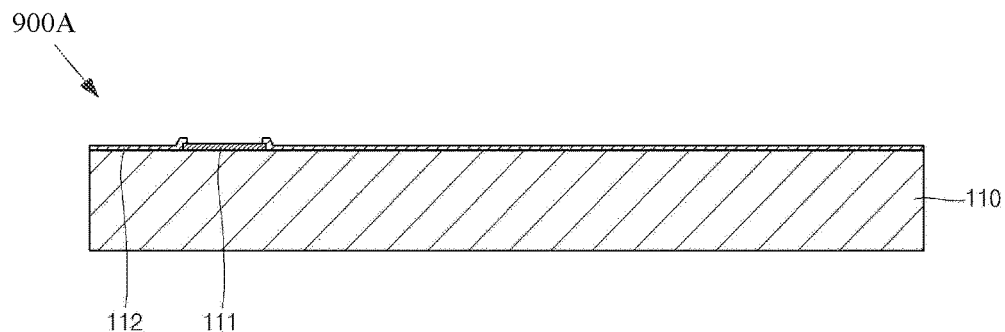
FIGS. 9A-9G show cross-sectional views illustrating an example semiconductor device and an example method of making a semiconductor device, in accordance with various aspects of the present disclosure.

FIG. 9A provides an example illustration of various aspects of block 810, for example the die-providing aspects. The example semiconductor die 110 may, for example, comprise a conductive pad 111 (or plurality thereof) on an upper side or surface thereof. The conductive pad 111 may, for example, provide for the inputting and/or outputting of electrical signals to and/or from the semiconductor die. The conductive pad 111 (or plurality thereof) may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive pad 111 may be formed in any of a variety of manners (e.g., electrolytic plating, electroless plating, chemical vapor deposition (CVD), sputtering or physical vapor deposition (PVD), plasma vapor deposition, printing, etc.), but the scope of the present disclosure is not limited thereto.

In addition, the semiconductor die 110 may comprise a die passivation layer 112, which may also be referred to as a dielectric layer, that surrounds and/or covers the lateral side(s) of the conductive pad 111 and/or a peripheral region of an upper side or surface of the conductive pads 111, and the upper side or surface of the semiconductor die 110. The die passivation layer 112 may comprise any or more of a variety of materials (e.g., inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material layer, a phenolic resin, an epoxy, etc.)), but the scope of the present disclosure is not limited thereto. The die passivation layer 112 may, for example, be formed in any of a variety of manners (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. The die passivation layer 112 may, for example, protect the upper side of the semiconductor die 110 and prevent short circuits from occurring between conductors.

Figure 9B:
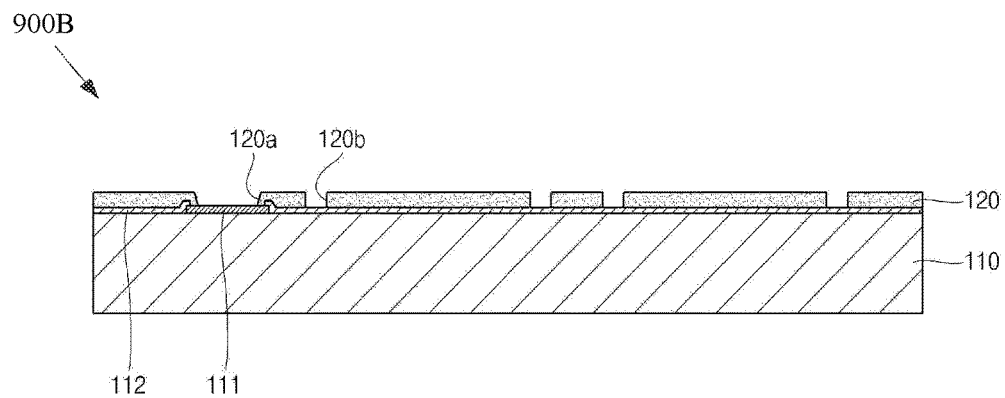

The example method 800 may, at block 820, comprise forming a first dielectric layer on the semiconductor die 110 (e.g., on the conductive pad 111, on the die passivation layer 112, etc.). Block 820 may comprise forming the first dielectric layer in any of a variety of manners, non-limiting examples of which are provided herein. FIG. 9B provides an example illustration 900B of various aspects of block 820, for example the dielectric layer-forming aspects. Block 820 may, for example, comprise forming the first dielectric layer 120 as explained herein in the discussion of FIGS. 1-8 (e.g., with regard to the example semiconductor devices 100, 200, and 300; with regard to the first dielectric layer 120; etc.).

Figure 9C:
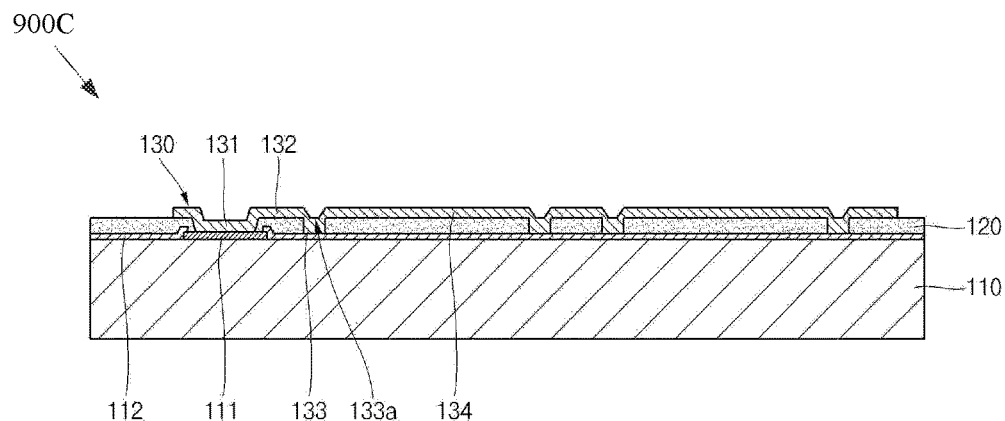

The example method 800 may, at block 830, comprise forming a conductive layer on the first dielectric layer formed at block 810 (e.g., on a top surface of the first dielectric layer, in openings formed in the first dielectric layer, etc.). Block 830 may comprise forming the conductive layer in any of a variety of manners, non-limiting examples of which are provided herein. FIG. 9C provides an example illustration 900C of various aspects of block 830, for example the forming of the conductive layer 130. Block 830 may, for example, comprise forming the conductive layer 130 as explained herein in the discussion of FIGS. 1-8 (e.g., with regard to the example semiconductor devices 100, 200, and 300; with regard to the example conductive layers 130, 430, 530, 630, and 730; etc.).

Figure 9D:
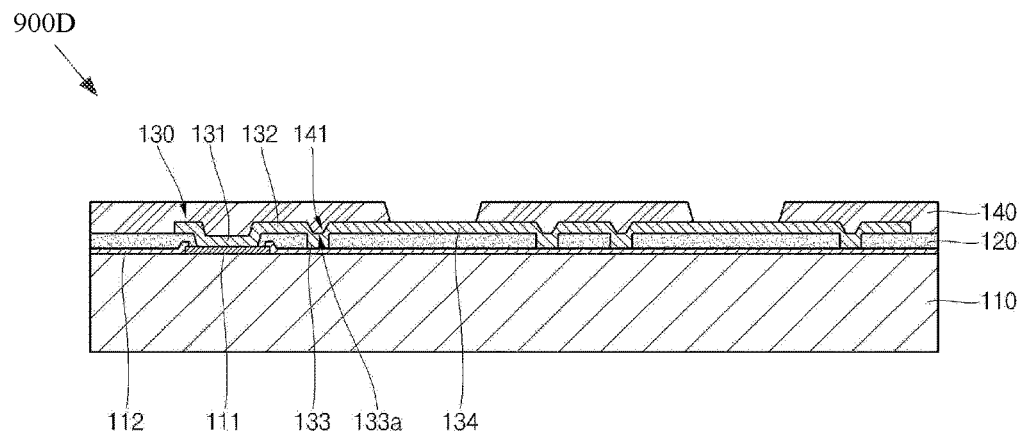

The example method 800 may, at block 840, comprise forming a second dielectric layer on the conductive layer and/or on the first dielectric layer. Block 840 may comprise forming the second dielectric layer in any of a variety of manners, non-limiting examples of which are provided herein. FIG. 9D provides an example illustration 900D of various aspects of block 840, for example the forming of the second dielectric layer 140. Block 840 may, for example, comprise forming the second dielectric layer as explained herein in the discussion of FIGS. 1-8 (e.g., with regard to the example semiconductor devices 100, 200, and 300; with regard to the example second dielectric layers 140 and 240; etc.).

Figure 9E:
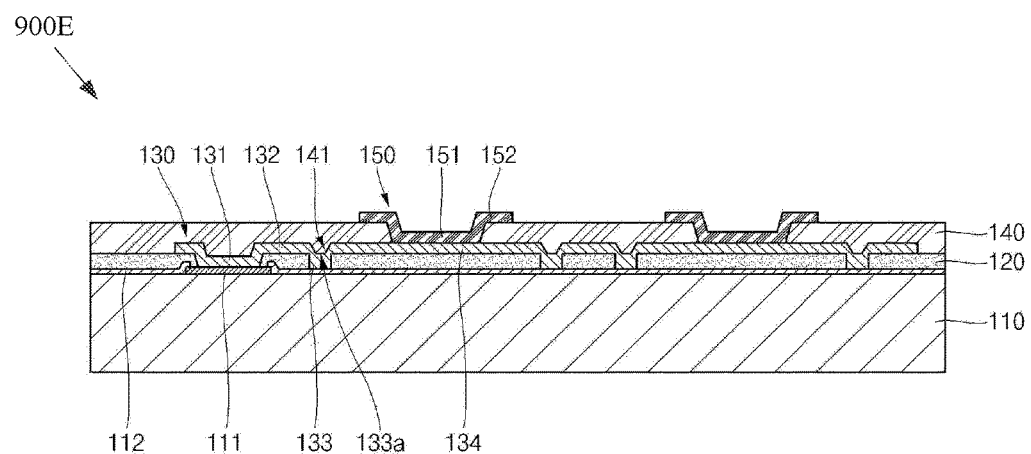

The example method 800 may, at block 850, comprise forming an under bump metal (UBM) structure, for example on the bump region of the conductive layer. Block 850 may comprise forming the UBM structure in any of a variety of manners, non-limiting examples of which are provided herein. FIG. 9E provides an example illustration 900E of various aspects of block 850, for example the forming of the UBM structure 150 (e.g., including the central region 151, the edge region 152, etc.). Block 850 may, for example, comprise forming the UBM structure 150 as explained herein in the discussion of FIGS. 1-8 (e.g., with regard to the example semiconductor devices 100, 200, and 300; with regard to the example UBM structure 150; etc.).

Figure 9F:
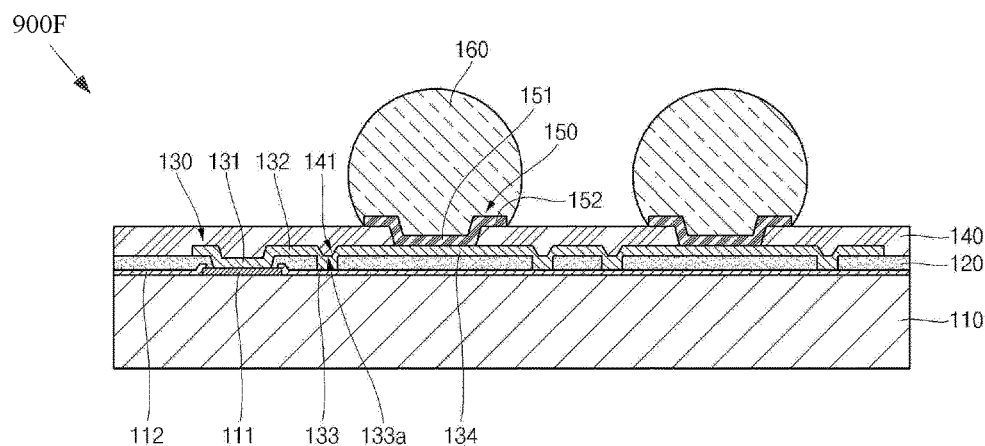

The example method 800 may, at block 860, comprise forming an interconnection structure, for example on the UBM structure formed at block 850. Block 860 may comprise forming the interconnection structure in any of a variety of manners, non-limiting examples of which are provided herein. FIG. 9F (or FIG. 1A) provides an example illustration 900F of various aspects of block 860, for example the forming of the interconnection structure 160. Block 860 may, for example, comprise forming the interconnection structure 160 as explained herein in the discussion of FIGS. 1-8 (e.g., with regard to the example semiconductor devices 100, 200, and 300; with regard to the example interconnection structure 160; etc.).

Figure 9G:
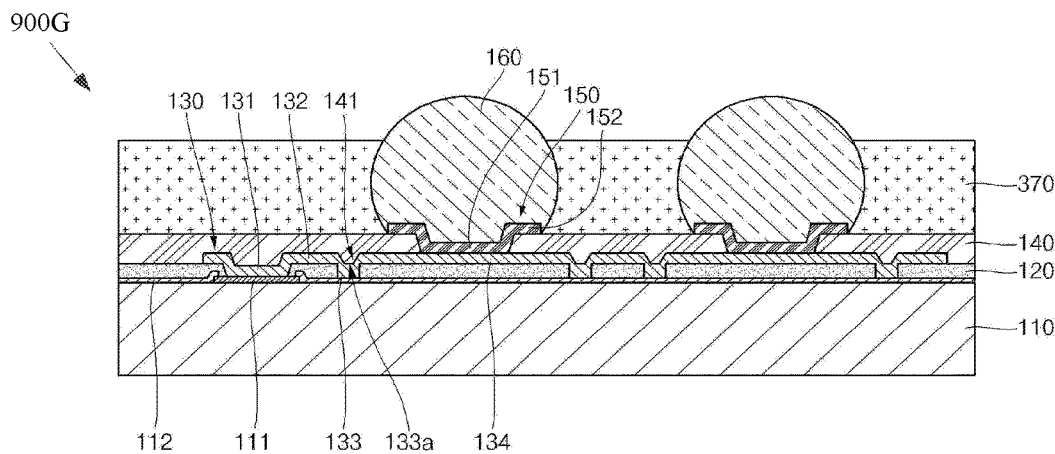

The example method 800 may, at block 870, comprise encapsulating the assembly. Block 870 may comprise performing the encapsulating in any of a variety of manners, non-limiting examples of which are provided herein. FIG. 9G (or FIG. 3) provides an example illustration 900G of various aspects of block 870, for example the forming of the encapsulant 370. Block 870 may, for example, comprise performing the encapsulating as explained herein in the discussion of FIGS. 1-8 (e.g., with regard to the example semiconductor device 300; with regard to the example encapsulant 370; etc.).

The example method 800 may, at block 895, comprise continuing processing of the semiconductor device. For example, in an example implementation in which various blocks of the example method 800 are performed at the wafer or panel level, block 895 may comprise performing a singulation operation (e.g., dicing) to separate individual packages from the wafer or panel. Also for example, block 895 may comprise performing testing, sampling, packaging, shipping, etc. Additionally for example, block 895 may comprise directing execution flow of the example method 800 back up to previous blocks of the method 800 or to other blocks of other methods.

In summary, various aspects of this disclosure provide a semiconductor package and a method of making a semiconductor package. As non-limiting examples, various aspects of this disclosure provide various semiconductor packages, and methods of making thereof, that comprise a conductive layer that comprises an anchor portion extending through at least one dielectric layer. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device comprising:
   a semiconductor die comprising a die passivation layer and a conductive pad exposed through an aperture in the die passivation layer;

a first dielectric layer (DL) on the die passivation layer
and comprising:
a first DL aperture through which the conductive pad is
exposed; and
a second DL aperture through which the die passivation
layer is exposed;
a conductive layer (CL) on the first dielectric layer and
comprising:
a first CL portion in the first DL aperture;
a second CL portion in the second DL aperture; and
a third CL portion;
a second dielectric layer (DL) on the conductive layer and
comprising a third DL aperture through which the third
CL portion is exposed; and
an interconnection structure electrically connected to the
third CL portion through the third DL aperture,
wherein the first CL portion comprises a pad region, the
second CL portion comprises an anchor region, and the
third CL portion comprises a bump region.

2. The semiconductor device of claim 1, comprising an under bump metallization (UBM) structure between the third CL portion and the interconnection structure.

3. A semiconductor device comprising:
a semiconductor die comprising a die passivation layer
and a conductive pad exposed through an aperture in
the die passivation layer;
a first dielectric layer (DL) on the die passivation layer
and comprising:
a first DL aperture through which the conductive pad is
exposed; and
a second DL aperture through which the die passivation
layer is exposed;
a conductive layer (CL) on the first dielectric layer and
comprising:
a first CL portion in the first DL aperture;
a second CL portion in the second DL aperture; and
a third CL portion;
a second dielectric layer (DL) on the conductive layer and
comprising a third DL aperture through which the third
CL portion is exposed;
an interconnection structure electrically connected to the
third CL portion through the third DL aperture; and
an under bump metallization (UBM) structure between
the third CL portion and the interconnection structure.

4. The semiconductor package of claim 3, wherein at least a portion of the second CL portion is positioned outside a footprint of the UBM structure.

5. The semiconductor device of claim 1, wherein the second CL portion directly contacts the die passivation layer.

6. A semiconductor device comprising:
a semiconductor die comprising a die passivation layer
and a conductive pad exposed through an aperture in
the die passivation layer;
a first dielectric layer (DL) on the die passivation layer
and comprising:
a first DL aperture through which the conductive pad is
exposed; and
a second DL aperture through which the die passivation
layer is exposed;
a conductive layer (CL) on the first dielectric layer and
comprising:
a first CL portion in the first DL aperture;
a second CL portion in the second DL aperture; and
a third CL portion;
a second dielectric layer (DL) on the conductive layer and
comprising a third DL aperture through which the third
CL portion is exposed; and
an interconnection structure electrically connected to the
third CL portion through the third DL aperture,
wherein the second CL portion surrounds the third CL
portion.

7. A semiconductor device comprising:
a semiconductor die comprising a die passivation layer
and a conductive pad exposed through an aperture in
the die passivation layer;
a first dielectric layer (DL) on the die passivation layer
and comprising:
a first DL aperture through which the conductive pad is
exposed; and
a second DL aperture through which the die passivation
layer is exposed;
a conductive layer (CL) on the first dielectric layer and
comprising:
a first CL portion in the first DL aperture;
a second CL portion in the second DL aperture; and
a third CL portion;
a second dielectric layer (DL) on the conductive layer and
comprising a third DL aperture through which the third
CL portion is exposed; and
an interconnection structure electrically connected to the
third CL portion through the third DL aperture,
wherein the second CL portion comprises a dimple on a
side of the second CL portion opposite the semiconductor die.

8. The semiconductor device of claim 7, wherein a portion of the second dielectric layer is in the dimple.

9. A semiconductor device comprising:
a conductive pad;
a first dielectric layer (DL) comprising a first DL aperture
through which the conductive pad is exposed;
a second dielectric layer (DL) on the first dielectric layer
and comprising a plurality of DL anchor apertures
through which the first dielectric layer is exposed;
a conductive layer (CL) on the second dielectric layer and
comprising a plurality of CL anchor portions, each in a
respective one of the DL anchor apertures; and
a third dielectric layer (DL) on the conductive layer and
comprising a DL aperture through which a portion of
the conductive layer is exposed,
wherein the plurality of CL anchor portions surround the
portion of the conductive layer exposed through the DL
aperture in the third dielectric layer.

10. The semiconductor device of claim 9, comprising a semiconductor die, wherein the conductive pad is a pad of the semiconductor die and the first dielectric layer is a passivation layer of the semiconductor die.

11. The semiconductor device of claim 9, wherein none of the plurality of CL anchor portions makes electrical contact with a semiconductor die through its respective DL anchor aperture.

12. The semiconductor device of claim 9, comprising an under bump metallization (UBM) structure on the portion of the conductive layer exposed through the aperture in the third dielectric layer.

13. The semiconductor device of claim 12, wherein at least a portion of each of the plurality of CL anchor portions is positioned outside a footprint of the UBM structure.

14. The semiconductor device of claim 9, wherein each of the plurality of CL anchor portions comprises a dimple on a side of said each of the plurality of second CL portions opposite the semiconductor die.

15. The semiconductor device of claim 9, wherein each of the plurality of CL anchor portions is circular.

16. A semiconductor device comprising:
a first dielectric layer (DL);
second dielectric layer (DL) comprising an anchor aperture exposing the first dielectric layer; and
a conductive layer (CL) on the second dielectric layer and comprising:
- a first CL end region electrically contacting another conductive layer;
- a second CL end region electrically contacting an interconnection structure of the semiconductor device;
- an extension region extending between the first and second CL end regions; and
- an anchor region in the anchor aperture and contacting the first DL, wherein:
the second dielectric layer comprises a plurality of additional anchor apertures exposing the first dielectric layer; and
the conductive layer comprises a plurality of additional anchor regions, each in a respective one of the additional anchor apertures.

17. The semiconductor device of claim 16, wherein the first dielectric layer is a passivation layer of a semiconductor die.

18. The semiconductor device of claim 16, comprising an under bump metallization (UBM) structure between the second CL end region and the interconnection structure.

19. The semiconductor device of claim 16, wherein the anchor region of the conductive layer comprises a dimple on a side of the anchor region opposite the semiconductor die.

20. The semiconductor device of claim 16, wherein the anchor region and the plurality of additional anchor regions surround the second CL end region.

* * * * *